(12) United States Patent
Yoshikawa et al.

(10) Patent No.: US 7,596,163 B2
(45) Date of Patent: Sep. 29, 2009

(54) VCSEL, MANUFACTURING METHOD THEREOF, MODULE, LIGHT SENDING DEVICE, OPTICAL SPATIAL TRANSMISSION DEVICE, LIGHT SENDING SYSTEM, AND OPTICAL SPATIAL TRANSMISSION SYSTEM

(75) Inventors: Masahiro Yoshikawa, Kanagawa (JP); Masateru Yamamoto, Kanagawa (JP); Takashi Kondo, Kanagawa (JP)

(73) Assignee: Fuji Xerox Co., Ltd., Tokyo (JP)

( * ) Notice: Subject to any disclaimer, the term of this patent is extended or adjusted under 35 U.S.C. 154(b) by 0 days.

(21) Appl. No.: 11/803,468

(22) Filed: May 15, 2007

(65) Prior Publication Data
US 2008/0056323 A1 Mar. 6, 2008

(30) Foreign Application Priority Data
Aug. 31, 2006 (JP) .............................. 2006-235681

(51) Int. Cl.
*H01S 5/00* (2006.01)
(52) U.S. Cl. ................................ 372/50.124; 372/43.01
(58) Field of Classification Search ............ 372/50.124, 372/43.01
See application file for complete search history.

(56) References Cited

U.S. PATENT DOCUMENTS

| | | | |
|---|---|---|---|
| 6,365,427 B1* | 4/2002 | Gauggel et al. ................ 438/22 |
| 6,720,585 B1 | 4/2004 | Wasserbauer et al. |
| 6,782,021 B2* | 8/2004 | Huang et al. ............ 372/45.013 |
| 2002/0176474 A1* | 11/2002 | Huang et al. ................... 372/96 |
| 2004/0219699 A1* | 11/2004 | Koyama et al. ................ 438/22 |
| 2005/0265415 A1* | 12/2005 | Lambkin .................. 372/43.01 |
| 2005/0271106 A1* | 12/2005 | Watanabe et al. ....... 372/46.013 |
| 2005/0286597 A1* | 12/2005 | Mukoyama et al. ....... 372/50.23 |
| 2007/0221908 A1* | 9/2007 | Takahashi et al. .............. 257/13 |

FOREIGN PATENT DOCUMENTS

| | | |
|---|---|---|
| CN | 1707888 A | 12/2005 |
| JP | 2001-284722 | 10/2001 |
| JP | 2002-208755 | 7/2002 |
| JP | 2004-241422 | 8/2004 |

\* cited by examiner

*Primary Examiner*—Minsun Harvey
*Assistant Examiner*—Phillip Nguyen
(74) *Attorney, Agent, or Firm*—Fildes & Outland, P.C.

(57) ABSTRACT

A VCSEL includes a substrate, a first semiconductor multilayer of a first conductivity-type, an active layer, a second semiconductor multilayer of a second conductivity-type, a contact layer, each of the layers stacked on the substrate. The second semiconductor multilayer constitutes a resonator together with the active layer and the first semiconductor multilayer. A metal layer is formed on the contact layer. The metal layer includes an opening portion that defines a region that emits laser light. When oscillation wavelength of the laser light is $\lambda$, optical thickness T of the contact layer and a top layer of the second semiconductor multilayer that contacts with the contact layer is smaller than $\lambda/4$.

20 Claims, 11 Drawing Sheets

Cross sectional view along line A-A

|  | Example | Related art |
|---|---|---|
| Top layer thickness T | λ/5 | λ/4 |
| Opening diameter D1 (μm) | 11 | 14 |
| Current confining diameter D2 (μm) | 13 | 13 |

352, 362 Flat-plate glass, 350, 310 Chip, 320 Conductive adhesive, 330 Stem, 340, 342, θ, 302

FIG. 13

400 Optical transmission device, 332, 350, 410 Housing, 340, 420 Sleeve, 422, 440 Optical fiber, 432, 430 Ferrule, 342, 330 310 350 360

FIG. 14

500 Spatial transmission system

FIG. 15

600 Optical transmission system

FIG. 16

700 Optical transmission device

FIG. 17

800 Video transmission system

FIG. 18

RELATED ART

VCSEL, MANUFACTURING METHOD THEREOF, MODULE, LIGHT SENDING DEVICE, OPTICAL SPATIAL TRANSMISSION DEVICE, LIGHT SENDING SYSTEM, AND OPTICAL SPATIAL TRANSMISSION SYSTEM

BACKGROUND

1. Technical Field

The present invention relates to a vertical-cavity surface-emitting laser diode (hereinafter referred to as VCSEL) that may be used as a light source of optical data processing or high-speed optical communication and a manufacturing method thereof, and more specifically to a technology of suppressing high-order transverse mode lasing.

2. Related Art

In technical fields such as optical communication or optical storage, there has been a growing interest in VCSEL. VCSELs have excellent characteristics which edge-emitting semiconductor lasers do not have. For example, VCSELs are characterized by lower threshold current and smaller power consumption. With a VCSEL, a round light spot can be easily obtained. Also, evaluation can be performed while VCSELs are on a wafer, and light sources can be arranged in two-dimensional arrays. With these characteristics, demands especially as light sources in the communication field have been expected to grow.

When a VCSEL is coupled to an optical fiber, it is desirable that laser light be in a single transverse mode or fundamental transverse mode. This is because single transverse mode has a smaller radiation angle and higher efficiency in coupling with an optical fiber or the like, than multi-mode has. Therefore, there have been proposals to suppress high-order transverse mode of laser light emitted from a VCSEL.

Figure 18:
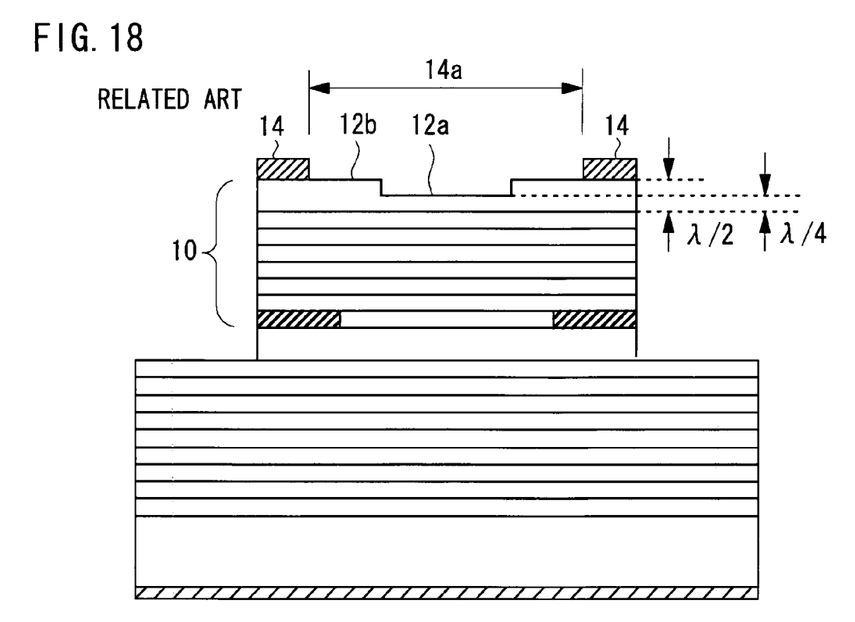
FIG. 18 is a cross sectional view showing a VCSEL of a related art.

For example, as shown in FIG. 18, a VCSEL includes a reflectivity adjusting layer 12 in the top layer of an upper mirror 10. The reflectivity adjusting layer 12 has a first mirror portion 12a having a thickness (thickness of λ/4) that meets the Bragg reflection condition, and a second mirror portion 12b having a thickness (thickness of λ/2) that meets the anti-Bragg reflection condition. Thus the reflectivity of the first mirror portion 12a is made greater than the reflectivity of the second mirror portion 12b. The first mirror portion 12a is formed in a center portion of the optical axis of an opening portion 14a of an upper electrode 14, and the second mirror portion 12b in a peripheral portion being away from the optical axis suppresses high-order transverse mode lasing, and thus single transverse mode lasing is obtained.

The structure of VCSEL of related art described above have a certain effect of suppressing high-order transverse mode, however, they do not always sufficiently suppress high-order transverse mode in a wide temperature range. When VCSELs are operated at a low temperature, there is a problem in that lasing starts from high-order transverse mode. The lasing increases lasing threshold value of low-order transverse mode, and thus lasing in the low-order transverse mode is less prone to occur. On the other hand, when VCSELs are operated in a high temperature, optical output is significantly reduced as compared with the case of at room temperature. Such problems are not known nor solved in any of related arts.

In addition, the suppression of high-order transverse mode proposed in the related art requires an etching process that may cause variations in thickness or cause steps in the reflectivity adjusting layer, and thus it is difficult to form an accurate thickness with a high degree of reproducibility, by the etching.

According to other related art, they suppress high-order transverse mode by the shape of the upper electrode. Therefore the shape of the upper electrode should be processed into a shape that matches to the shape of the dark portion of the emission pattern, and the processing is quite complicated. Furthermore, the shape corresponds to a specific transverse mode, and thus it is difficult to sufficiently perform suppression of high-order transverse mode.

An object of the present invention is to address the issues of related arts described above, and provide a VCSEL that is capable of suppressing high-order transverse mode in a wide temperature range. Another object of the present invention is to provide a method of manufacturing a VCSEL that is capable of suppressing high-order transverse mode without adding a complicated process.

SUMMARY

According to an aspect of the invention, there is provided a VCSEL that includes a substrate, a first semiconductor multilayer of a first conductivity-type, an active layer, a second semiconductor multilayer of a second conductivity-type, a contact layer, each of the layers being stacked on the substrate, and a metal layer formed on the contact layer. The second semiconductor multilayer constitutes a resonator together with the active layer and the first semiconductor multilayer. The metal layer includes an opening portion that defines a region that emits laser light. When oscillation wavelength of the laser light is λ, optical thickness T of the contact layer and a top layer of the second semiconductor multilayer that contacts with the contact layer is smaller than λ/4.

BRIEF DESCRIPTION OF THE DRAWINGS

Exemplary embodiments of the present invention will be described in detail based on the following figures, wherein.

DETAILED DESCRIPTION

Referring to the accompanying drawings, exemplary embodiments of the present invention will be now described.

Figure 1:
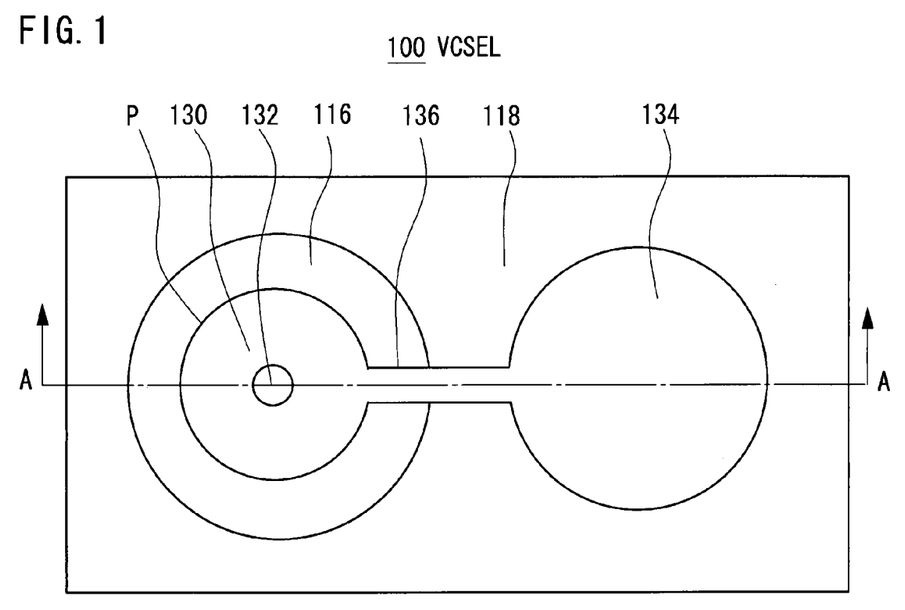
FIG. 1 is a plan view of a VCSEL according to an exemplary embodiment of the invention.
Figure 2:
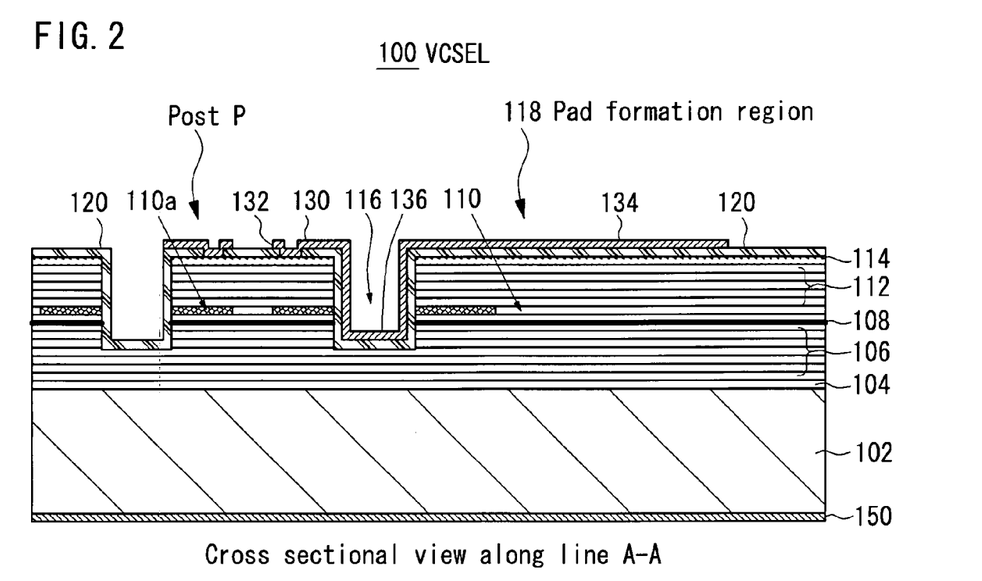
FIG. 2 is a cross sectional view taken along line A-A of FIG. 1.

FIG. 1 is a plan view of a VCSEL according to an exemplary embodiment of the invention, and FIG. 2 is a cross sectional view taken along line A-A of FIG. 1. As shown in FIG. 2, a VCSEL 100 includes an n-side electrode 150 on the back surface of an n-type GaAs substrate 102. Stacked on the substrate 102 are semiconductor layers that include an n-type GaAs buffer layer 104, a lower DBR (Distributed Bragg Reflector) 106 made of an n-type AlGaAs semiconductor multilayer, an active region 108, a current confining layer 110 made of p-type AlAs, an upper DBR 112 made of a p-type AlGaAs semiconductor multilayer, and a p-type GaAs contact layer 114.

To the substrate 102, a ring-shaped groove 116 is formed by etching the semiconductor layers such that the groove 116 has a depth from the contact layer 114 to a portion of the lower DBR 106. By the groove 116, a cylindrical post P that is a laser light emitting portion is defined. Isolated by the groove 116, a pad formation region 118 is formed. In the post P, a resonator structure made of the lower DBR 106 and the upper DBR 112 is formed, and therebetween, the active region 108 and the current confining layer 110 are interposed. The current confining layer 110 includes an oxidized region 110a in which AlAs being exposed on the side surface of the post P is selectively oxidized, and a conductive region surrounded by the oxidized region. The current confining layer 110 confines current and light in the conductive region. The shape of the conductive region in a plan view is a round shape that reflects the outline of the post P.

On the entire surface of the substrate including the groove 116, an interlayer insulating film 120 is formed. The interlayer insulating film 120 covers the surface of the post P, side surface of the post P exposed by the groove 116, the groove 116, side surface of the pad formation region 118 exposed by the groove 116, and surface of the pad formation region 118. At a top portion of the post P, an annular contact hole is formed in the interlayer insulating film 120, and through the contact hole, a p-side round-shaped upper electrode 130 is electrically connected to the contact layer 114. The p-side upper electrode 130 is made of gold or titanium/gold, and at a center portion thereof, a round-shaped opening 132 that defines a laser light emitting portion is formed. In the example of FIG. 2, the opening 132 is blocked by the interlayer insulating film 120 and protected such that the GaAs contact layer 114 is not exposed to the outside. The opening 132 is not necessarily blocked by the interlayer insulating film 120, and may be exposed.

In the pad formation region 118, a round-shaped electrode pad 134 is formed on the interlayer insulating film 120. The electrode pad 134 is connected to the p-side upper electrode 130 via an extraction electrode wiring 136 that extends in the groove 116.

Figure 3:
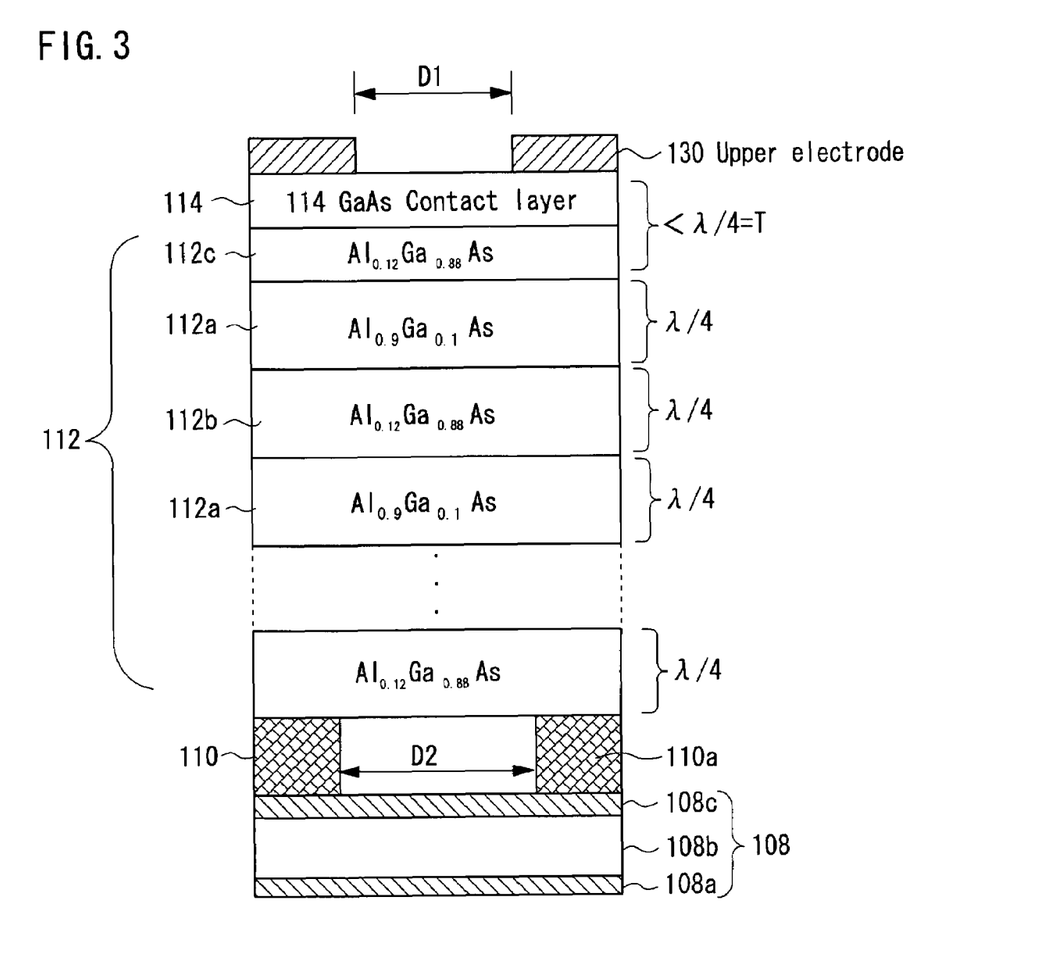
FIG. 3 illustrates a detail of the relation between the thickness of the contact layer and the upper DBR shown in FIG. 2.

FIG. 3 is an enlarged cross sectional view of a top portion of the post P of FIG. 2, and illustrates the relation between the top layer of the upper DBR and the contact layer, and the relation between the top layer of the upper DBR and the active region. The upper DBR 112 is made by alternately stacking 30 periods of high-Al-composition $Al_{0.12}Ga_{0.1}As$ layers 112a and low-Al-composition $Al_{0.12}Ga_{0.88}As$ layers 112b such that the thickness of each of the layers becomes ¼ of the wavelength in the medium.

In this exemplary embodiment, the thickness $T_c$ of an $Al_{0.12}Ga_{0.88}As$ layer 112c being the final layer or top layer of the upper DBR is formed thinner than the thickness of other $Al_{0.12}Ga_{0.88}As$ layers 112b. In other words, the optical thickness T (hereinafter referred to as "top layer thickness T") that is sum of the thickness of the $Al_{0.12}Ga_{0.88}As$ layer 112c being the final layer and the thickness of the GaAs contact layer 114 is made smaller than $\lambda/4n_r$. AlGaAs layer having a lower-Al-composition is less susceptible to oxidation, and easier to obtain electrical contact, and thus the contact layer is formed on the $Al_{0.12}Ga_{0.88}As$ layer 112c. The thickness $T_g$ of the contact layer may be 20 nanometers (nm), for example. The λ indicates oscillation wavelength of laser light, and is about 850 nm in this example, and $n_r$ indicates refractive index of the medium. If the refractive index of the top layer 112c is $n_1$ and the refractive index of the contact layer is $n_2$, then the top layer thickness T can be expressed as $T=n_1 T_c + n_2 T_g < \lambda/4$.

The current confining layer 110 interposed between a lowermost layer of the upper DBR 112 or the upper DBR 112 and the active region 108 includes the conductive region surrounded by the oxidized region 110a. The oxidized region 110a is formed such that it reflects the outline of the post. If the post P is cylindrical, then the shape of the conductive region in a plan view is a round shape. The diameter of the conductive region is the diameter of the round shape. In a case the post P has a rectangular shape and the conductive region has a rectangular shape, the size of the conductive region is the length of a diagonal line of the rectangular. The center in a direction of the optical axis of the conductive region is approximately aligned with the center of the round-shaped opening 132 of the upper electrode 130. If the diameter of the opening 132 is D1 and the diameter of the conductive region is D2, then D2−D1=0 to 3 μm preferably, and 1 to 2 μm more preferably.

The active region 108 is formed of an undoped lower $Al_{0.6}Ga_{0.4}As$ spacer layer 108a, an undoped quantum well active layer 108b (made of three GaAs quantum well layers each having a thickness of 70 nm and four $Al_{0.3}Ga_{0.7}As$ barrier layers each having a thickness of 50 nm), and an undoped upper $Al_{0.6}Ga_{0.4}As$ spacer layer 108c. In the VCSEL of this exemplary embodiment, each of the composition of the semiconductor layers is selected such that the difference between the bandgap energy Eg1 of low-Al-composition layers of the upper DBR, i.e., the $Al_{0.12}Ga_{0.88}As$ layers 112b and the $Al_{0.12}Ga_{0.88}As$ layer 112c being the final layer, and the bandgap energy Eg2 of quantum well active layer 108b, |Eg1-Eg2|, becomes equal to or greater than 0.1 electron volts (eV) and equal to or smaller than 0.3 eV. By limiting the difference between these bandgap energies in a range from 0.1 to 0.3 eV, the reduction in optical output is suppressed within a certain amount when the VCSEL is operated in a high temperature, as described later.

Figure 4:
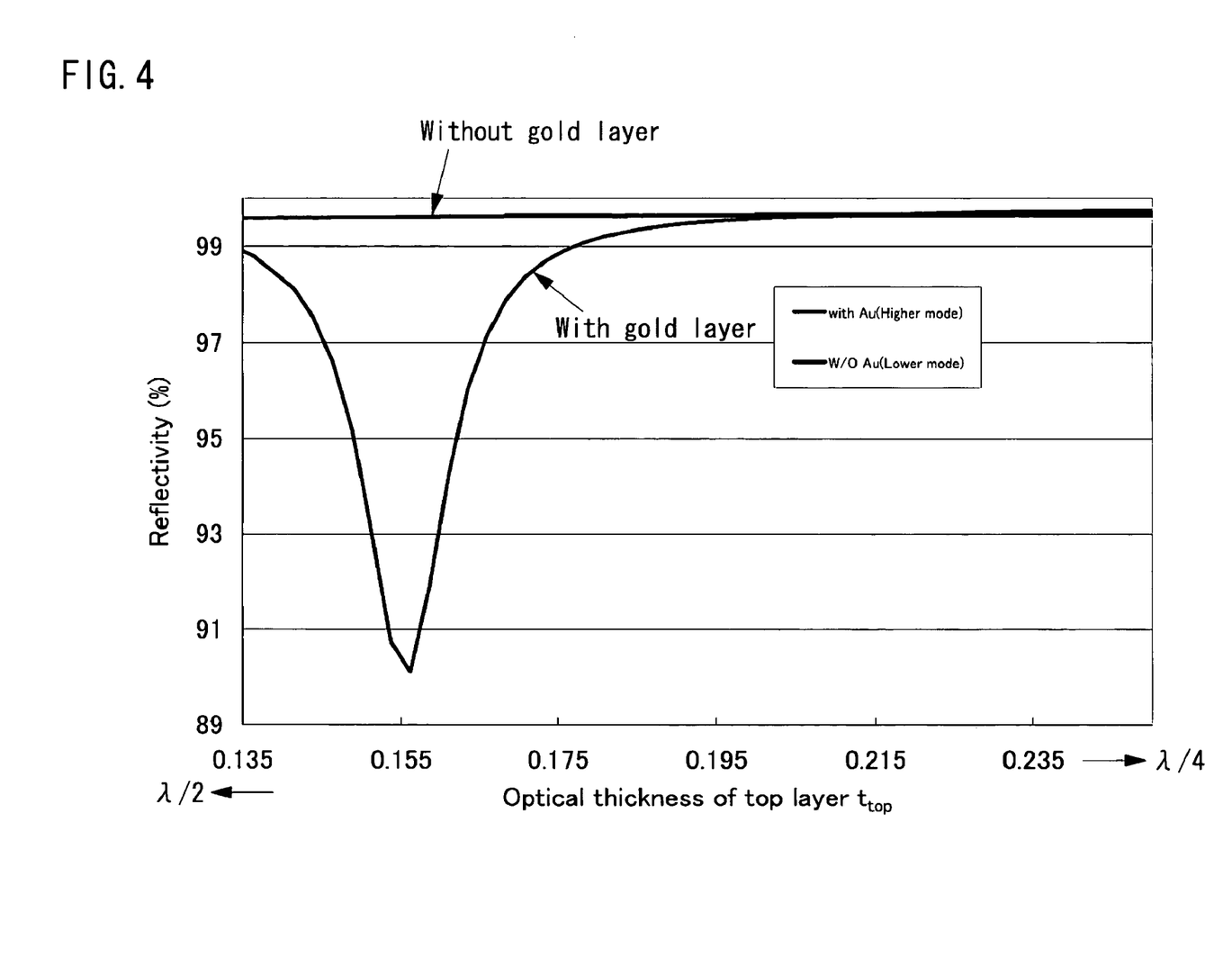
FIG. 4 is a graph showing the relation between the top layer thickness and reflectivity.

FIG. 4 is a graph showing the relation between the top layer thickness T and reflectivity of the upper DBR. The horizontal axis indicates the top layer thickness T (optical thickness being sum of the thickness of the contact layer and the thickness of the top layer of the upper DBR), and the vertical axis indicates reflectivity. Shown in the graph are a curve for a case a gold layer is used as an upper electrode and a curve for a case without gold layer. As obvious from the graph, in the case the gold layer is not formed, reflectivity does not vary so much even though the top layer thickness T varies. In other words, near the optical axis of the opening 132 formed in the upper electrode 130, reflectivity does not vary so much, and the reflectivity is as high as more than 99%.

On the other hand, in a region in which the gold layer being the upper electrode 130 is formed, when the top layer thickness T is near $\lambda/4$, the reflectivity is slightly smaller than the reflectivity of the region without gold layer. This reflectivity does not vary when the top layer thickness T decreases down to about 0.215 $\lambda$. As the top layer thickness T further decreases below 0.195 $\lambda$, the reflectivity decreases, and when the top layer thickness T is about 0.155 $\lambda$, the reflectivity becomes about 90%, which is the minimum value. If the top layer thickness T further decreases below 0.155 $\lambda$, the reflectivity rises again.

In the VCSEL of this exemplary embodiment, the difference between the reflectivity of the region without gold layer, that is, near the optical axis of the opening 132, and the reflectivity of the region with a gold layer, the region spaced from the optical axis, is made greater than the difference in these reflectivities of a VCSEL of a related art (when the top layer thickness T is $\lambda/4$ or the top layer 112c is $\lambda/4$), thereby high-order transverse mode lasing is more effectively suppressed, and increase of lasing threshold value of low-order transverse mode is suppressed. As a result, a constant output is obtained when a VCSEL is operated at a low temperature.

The inventor found that by making the top layer thickness T in a range of $(0.195\pm0.02)\lambda$, especially near 0.195 $\lambda$, high-order transverse mode can be preferably suppressed. The inventor also found that, if the top layer thickness T is in a range of $(0.155\pm0.02)\lambda$, the reflectivity becomes too small to obtain a good low-order transverse mode lasing.

Figure 5:
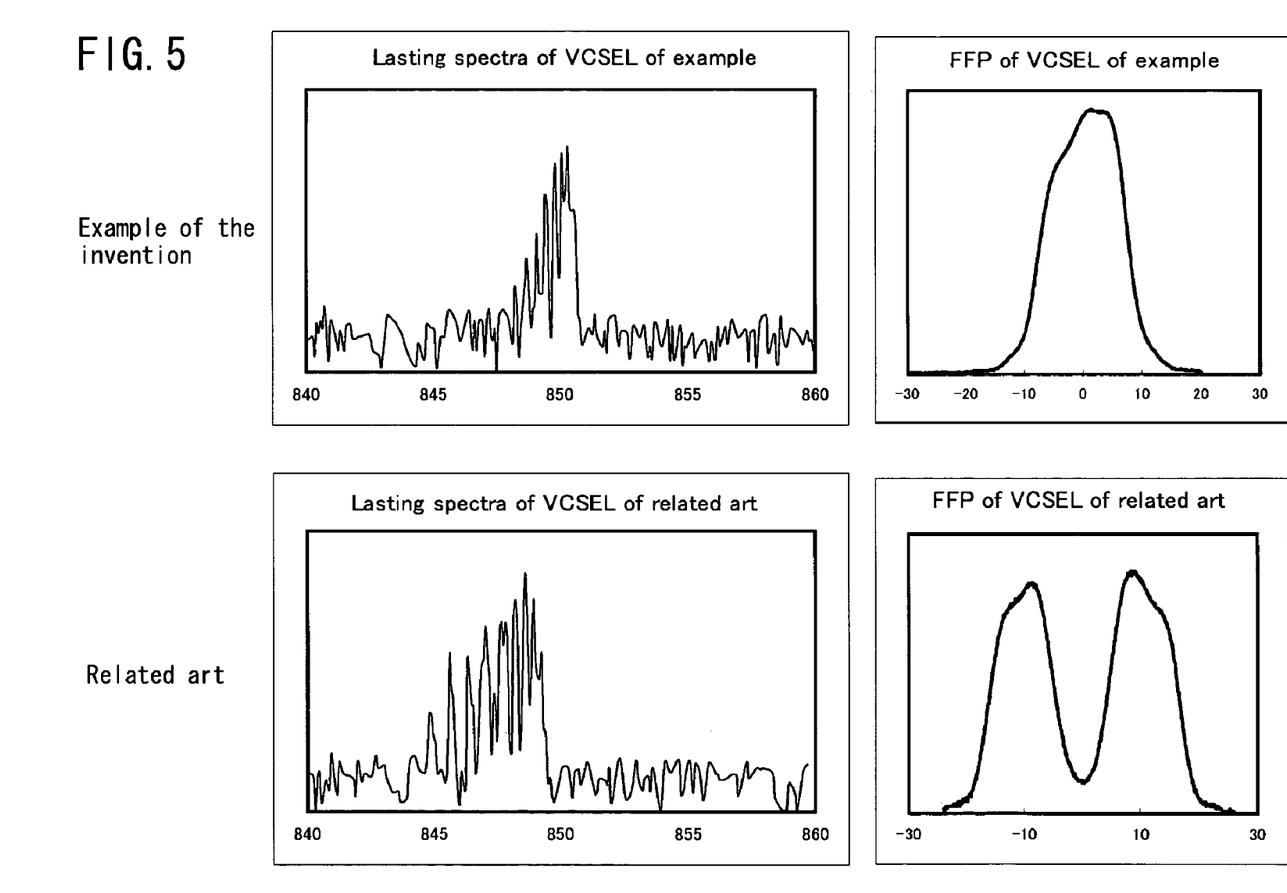
FIG. 5 illustrates lasing spectra and far field pattern of a VCSEL of an exemplary embodiment, and lasing spectra and far field pattern of a VCSEL of a related art.
Figure 6:
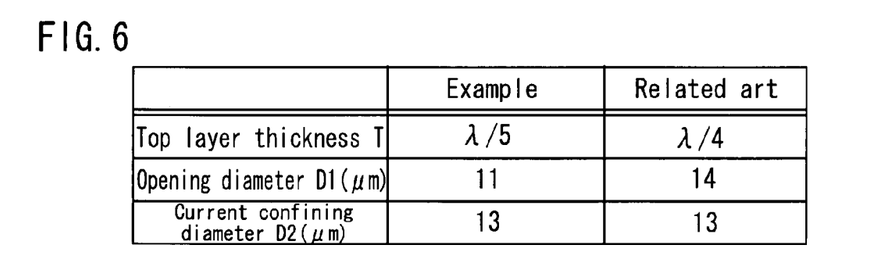
FIG. 6 is a table showing the sizes of each portion of the VCSEL of the exemplary embodiment and a VCSEL of a related art.

FIG. 5 illustrates the suppression of high-order transverse mode according to a VCSEL of an exemplary embodiment. Upper two waveforms indicate lasing spectra and far field pattern (FFP) of laser light of a VCSEL of an exemplary embodiment, and lower two waveforms indicate those of a VCSEL of a related art. FIG. 6 shows a comparison of the size of the VCSEL of the exemplary embodiment and the size of the VCSEL of a related art when the waveforms of FIG. 5 are obtained.

By comparing the lasing spectra, it can be observed that, in the VCSEL of the exemplary embodiment, fundamental transverse mode lasing occurs near 850 nm, and high-order transverse mode is suppressed near 850 nm. On the contrary, in the VCSEL of a related art, multiple lasing of high-order mode occurs near 850 nm. By comparing FFP, it can be observed that high-order transverse mode is suppressed and thus light intensity that is nearly single-peaked pattern is obtained in the VCSEL of the exemplary embodiment, while the light intensity of the VCSEL of a related art is double-peaked pattern.

Figure 7:
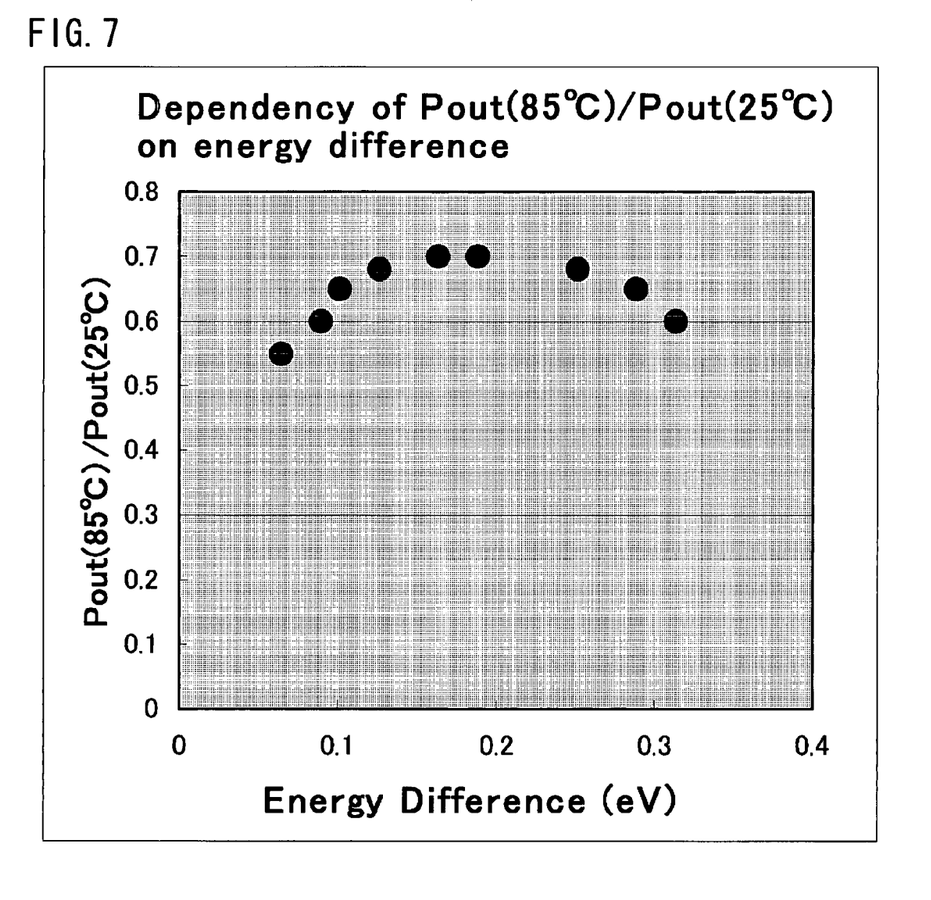
FIG. 7 is a graph showing temperature dependency of power ratio between 85 and 25 degrees Celsius on bandgap energy difference when a VCSEL is operated with a constant driving current.

FIG. 7 is a graph showing temperature dependency of optical output ratio on energy gap difference when a VCSEL is operated with a constant driving current. The vertical axis indicates the ratio between the optical outputs when a VCSEL of an exemplary embodiment is operated in a high temperature (ambient temperature of VCSEL being at 85 degrees Celsius) and the optical output when operated at room temperature (25 degrees Celsius). The horizontal axis indicates the difference between the bandgap energy of the low-Al-composition AlGaAs layer contained in upper DBR and the bandgap energy of the active layer. A higher value of the ratio between these optical outputs means that the reduction in optical output when operated in a high temperature is smaller. As obvious from FIG. 7, in a range where the energy difference is equal to or greater than 0.1 eV and equal to or smaller than 0.3 eV, the ratio between these optical outputs becomes equal to or greater than 0.6; in other words, the reduction in optical output in a high temperature becomes below 40%, and thus a preferable performance at high temperature operating condition can be obtained. In a case the energy difference is below 0.1 eV, heat generation increases due to light absorption by the AlGaAs layer that makes up a Distributed Bragg Reflector and has a high refractive index, and optical output in a high temperature decreases. In a case the energy difference is above 0.3 eV, the difference in refractive index between each of the semiconductor layers that make up the Distributed Bragg Reflector decreases, and thus the reflectivity decreases and threshold value rises, thereby the optical output in a high temperature with a constant driving current is decreased in whole. If the number of pairs of the AlGaAs layers is increased to increase the reflectivity, element resistance increases and heat generation increases, and thus the optical output in a high temperature with a constant driving current decreases.

As described above, in a VCSEL of an exemplary embodiment, the top layer thickness T is made smaller than $\lambda/4$, thereby high-order transverse mode lasing when operated at a low temperature is suppressed, and a higher optical output than that of a VCSEL of a related art can be obtained. In addition, the top layer thickness T is easily manufactured because only the thickness of the top layer 112c of the upper DBR 112 is to be changed, and there is no need to add additional process to conventional manufacturing process. Furthermore, by selecting composition such that the difference of the bandgap energy of low-Al-composition layers of the upper DBR and the bandgap energy of the active layer becomes in a range from 0.1 to 0.3 eV, high optical output can be obtained even when operated in a high temperature.

Shown in the exemplary embodiments described above is a VCSEL in which an AlGaAs system compound semiconductor is used, however, the present invention can also be applicable to a VCSEL in which other III-V group compound semiconductor is used. In the exemplary embodiment, the current confining layer formed in the VCSEL is a single layer; however, it may be plural layers, and is preferably disposed near the active layer. In addition, the shape of the post may be rectangular, other than cylindrical shape.

Figures 8, 8A:
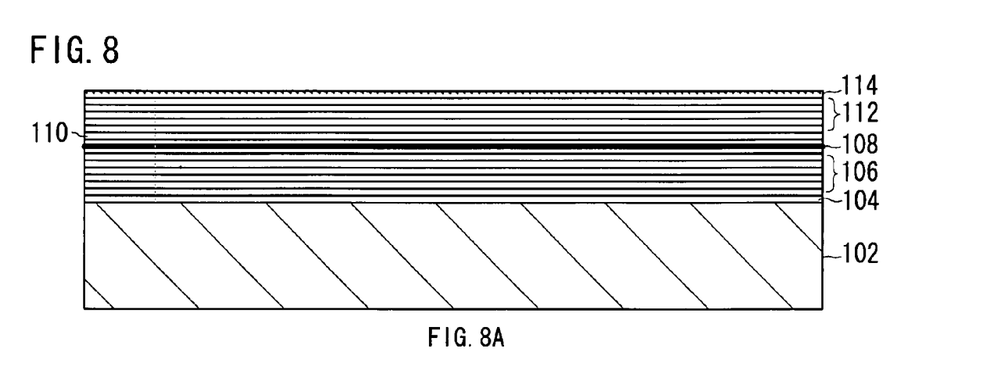
FIGS. 8A to 8C are cross sectional views illustrating steps of a method for manufacturing a VCSEL according to a first exemplary embodiment of the present invention.

Referring now to FIGS. 8A to 10B, a method for manufacturing a VCSEL of an exemplary embodiment will be described. As shown in FIG. 8A, by Metal organic Chemical Vapor Deposition (MOCVD), on a surface of an n-type GaAs substrate 102, the n-type buffer layer 104 having a carrier concentration of $1\times10^{18}$ cm$^{-3}$ and a thickness of about 0.2 μm is deposited. On the buffer layer 104, 40.5 periods of $Al_{0.9}Ga_{0.1}As$ and $Al_{0.12}Ga_{0.88}As$, each having a thickness of ¼ of the wavelength in the medium are alternately stacked to form the lower n-type DBR 106 having a carrier concentration of $1\times10^{18}$ cm$^{-3}$ and a total thickness of about 4 μm. Sequentially stacked thereon are: an active region 108 made of an undoped lower $Al_{0.6}Ga_{0.4}As$ spacer layer, an undoped quantum well active layer (made of three GaAs quantum well layers each having a thickness of 70 nm and four $Al_{0.3}Ga_{0.7}As$ barrier layers each having a thickness of 50 nm), and an undoped upper $Al_{0.6}Ga_{0.4}As$ spacer layer; a p-type AlAs layer 110; the upper p-type DBR 112 having a carrier concentration of $1\times10^{18}$ cm$^{-3}$ and a total thickness of about 2 μm that is made by stacking 30 periods of $Al_{0.9}Ga_{0.1}As$ and $Al_{0.12}Ga_{0.88}As$ such that the thickness of each of the layers becomes ¼ of the wavelength in the medium; and the p-type GaAs contact layer 114 having a carrier concentration of $1\times10^{19}$ cm$^{-3}$ and a thickness of about 20 nm.

In this stacking, the $Al_{0.12}Ga_{0.88}As$ layer 112c (see FIG. 3) that is the final layer of the upper p-type DBR 112 is stacked such that the thickness of the layer 112c becomes different from, i.e. smaller than, the thickness of other $Al_{0.12}Ga_{0.88}As$ layers 112b. This can be achieved by controlling deposition time. In addition, the Al-composition of the low-Al-composition $Al_{0.12}Ga_{0.88}As$ layers 112b and 112c of the upper DBR 112 is selected such that the difference in bandgap energy between the $Al_{0.12}Ga_{0.88}As$ layers and the quantum well active layer becomes in a range from 0.1 to 0.3 eV.

Deposition to form these layers is continuously performed by using trimethyl gallium, trimethyl aluminum, and arsine as source gases, which are changed sequentially, and using cyclopentadinium magnesium as a p-type dopant, and silane as an n-type dopant, with the substrate temperature being kept at 750 degrees Celsius, without breaking vacuum. Although not described in detail, to reduce electrical resistance of the DBR, a region having a thickness of about 20 nm in which the Al-composition varies stepwise from 90% to 12% can be provided on the interface between $Al_{0.9}Ga_{0.1}As$ and $Al_{0.12}Ga_{0.88}As$.

Figure 8B:
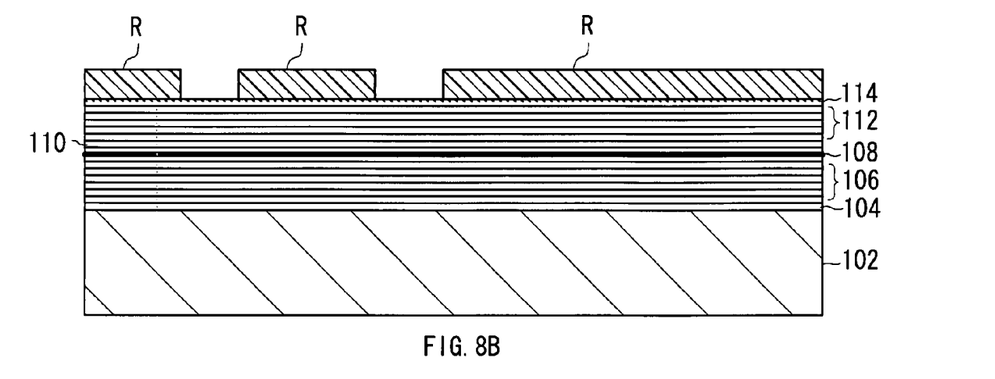
Figure 8C:
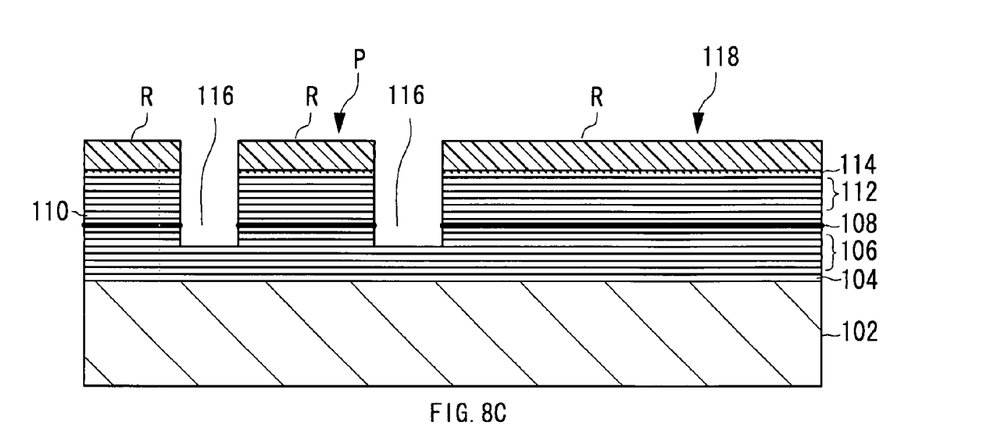

Next, as shown in FIG. 8B, by using a photolithography process, a resist mask R is formed on the crystal growth layer. Then, a reactive ion etching is performed by using boron trichloride as etching gas to form the ring-shaped groove 116 to a middle portion of the lower DBR 106, as shown in FIG. 8C. By this process, a cylindrical semiconductor post P having a diameter of about 10 to 30 μm or a rectangular prism shaped semiconductor post P and the pad formation region 118 surrounding the post P are formed.

Figures 9, 9A:
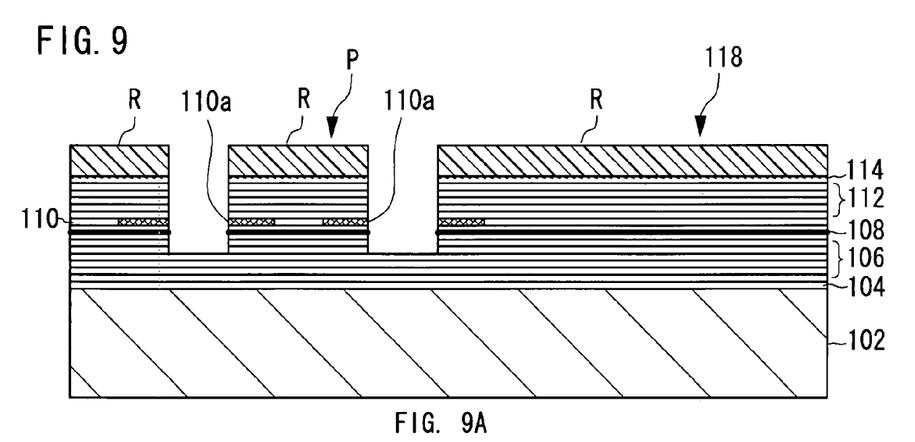
FIGS. 9A to 9C are cross sectional views illustrating steps of a method for manufacturing a VCSEL according to a first exemplary embodiment of the present invention.

Then, as shown in FIG. 9A, the substrate is exposed to a vapor atmosphere at 340 degrees Celsius, for example, for a certain amount of time to perform oxidation process. The AlAs layer that makes up the current confining layer 110 has a significantly faster oxidation speed than the $Al_{0.9}Ga_{0.1}As$ layer or $Al_{0.12}Ga_{0.88}As$ layer, which also make up a portion of the current confining layer 110, and thus the oxidized region 110a that reflects the shape of the post P is formed from side surface of the post P, and a non-oxidized region (conductive region) that is left unoxidized becomes a current injecting region or conductive region. During this process, by controlling the distance of oxidation, a diameter D2 of the conductive region can be obtained.

Figure 9B:
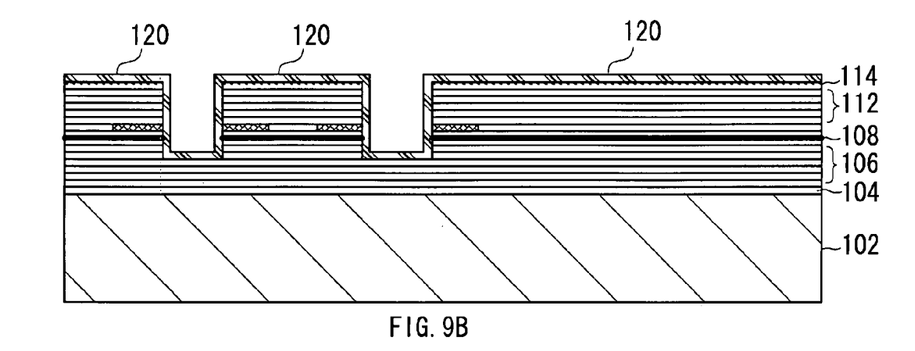
Figure 9C:
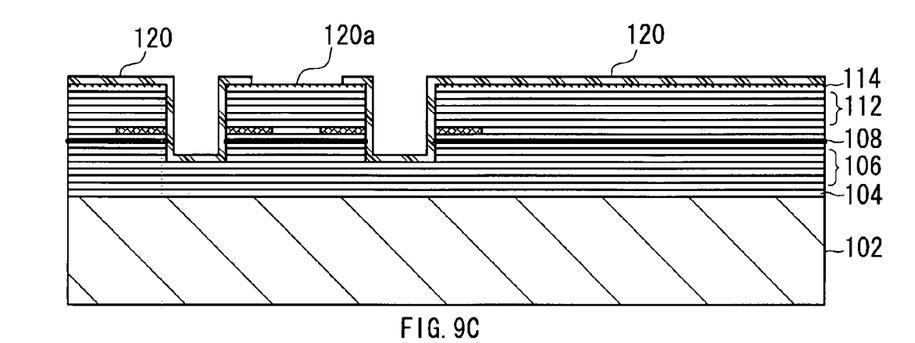

Next, after removing the resist R, as shown in FIG. 9B, by using a plasma CVD apparatus, the interlayer insulating film 120 made of SiN is deposited on the entire surface of the substrate including the groove 116. After that, as shown in FIG. 9C, the interlayer insulating film 120 is etched by using a general photolithography process to form a round-shaped contact hole 120a in the interlayer insulating film 120 at a top portion of the post P, and to expose the contact layer 114. Alternatively, the contact hole 120a may be made in a ring-shaped, and the contact layer 114 that becomes an emission region may be protected with SiN, as shown in FIG. 2.

Figures 10, 10A, 10B:
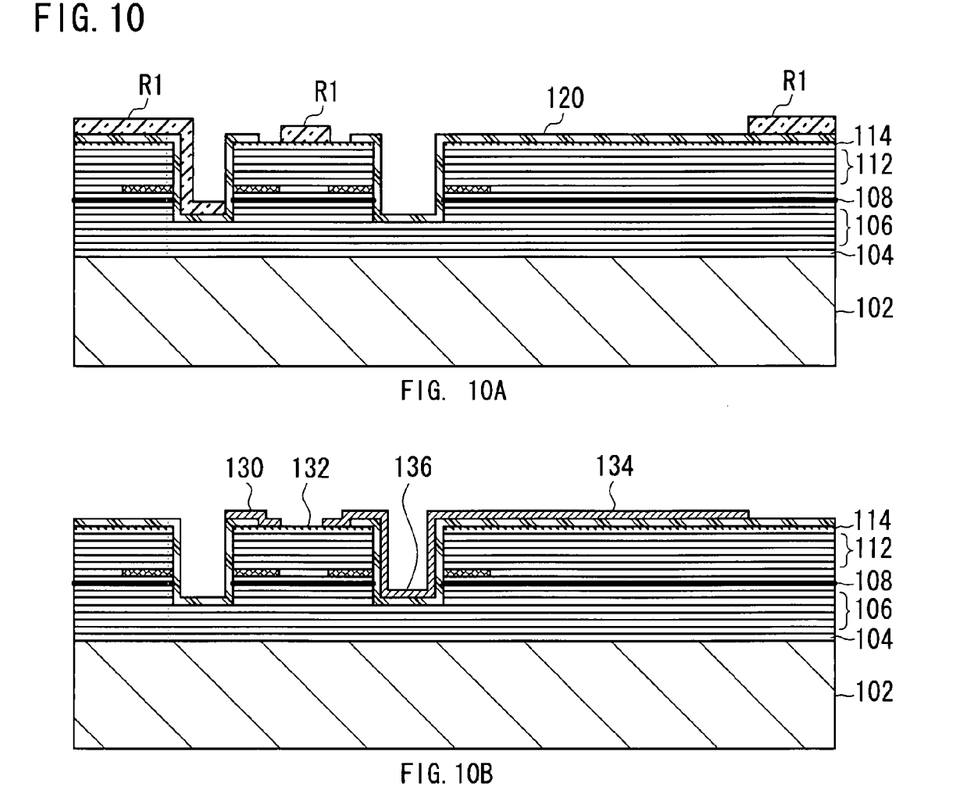
FIGS. 10A and 10B are cross sectional views illustrating steps of a method for manufacturing a VCSEL according to a first exemplary embodiment of the present invention.

After that, as shown in FIG. 10A, a resist pattern R1 is formed in a center portion of an upper portion of the post P by using a photolithography process. From above the resist pattern R1, by using an EB deposition apparatus, 100 to 1000 nm, and preferably 600 nm, of Au is deposited as a p-side electrode material. When the resist pattern R1 is peeled off, the Au on the resist pattern R1 is removed, as shown in FIG. 10B, and the upper electrode 130, the electrode pad 134, and the extraction wiring 136 are formed. From the portion without p-side electrode, that is, from the opening 132 at a center portion of the post, laser light is emitted. The diameter of the opening 132 is preferably about 3 to 20 μm. Although not described here in detail, a metal opening portion formed on the post P may be formed prior to formation of the post.

On the back surface of the substrate, Au/Ge is deposited as an n-electrode. After that, annealing is performed with an annealing temperature at 250 to 500 degrees Celsius, and preferably at 300 to 400 degrees Celsius, for 10 minutes. The annealing time is not necessarily limited to 10 minutes, and may be in a range from 0 to 30 minutes. Also, the deposition method is not necessarily limited to the EB deposition, and a resistance heating method, sputtering method, magnetron sputtering method, or CVD method may be used. In addition, the annealing method is not necessarily limited to thermal annealing using a general electric furnace, and a similar effect can be obtained by flash annealing or laser annealing using infrared radiation, annealing by high frequency heating, annealing by electron beam, or annealing by lamp heating.

Figure 11:
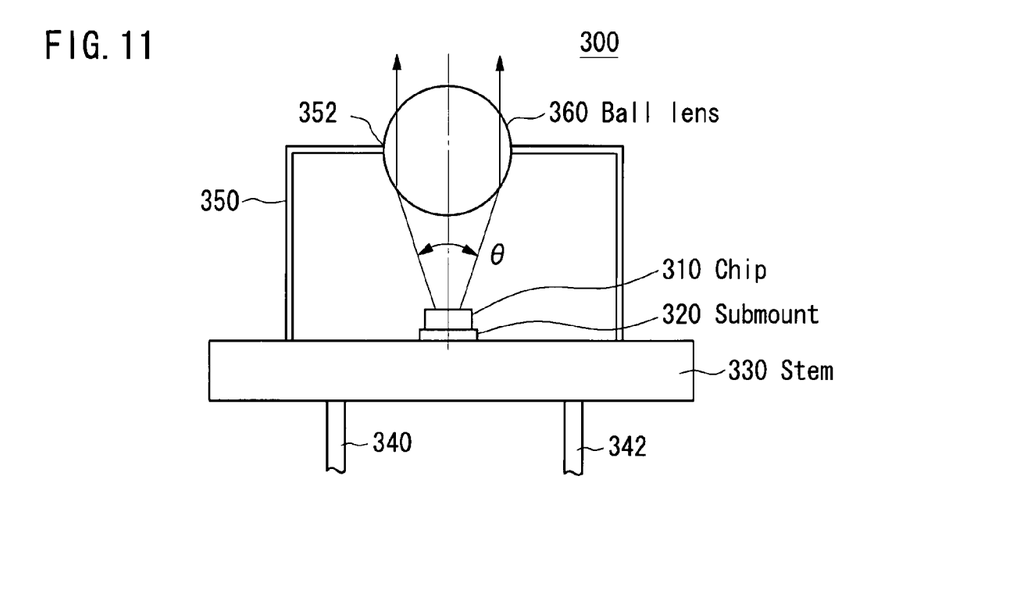
FIG. 11 is a schematic cross sectional view of a configuration of a package in which a semiconductor chip in which a VCSEL is formed is mounted.

FIG. 11 is a schematic cross sectional view of an example of a package (module) of a semiconductor laser device in which a VCSEL chip is mounted. In a package 300, a chip 310 in which a VCSEL is formed is fixed on a submount 320 on a metal stem 330. Conductive leads 340 and 342 are inserted into through holes (not shown) in the stem 330. One lead 340 is electrically coupled to the n-side lower electrode 150 formed on the back surface of the chip 310, and the other lead 342 is electrically coupled to the p-side electrode 130 formed on the upper surface of the chip 310, for example, via a bonding wire.

In an emitting window 352 of a cap 350, a ball lens 360 is fixed. The optical axis of the ball lens 360 is positioned to match an approximate center of the opening 132 of the chip 310. The distance between the chip 310 and the ball lens 360 is adjusted such that the ball lens 360 is contained within the radiation angle θ of the laser light from the chip 310. When a forward voltage is applied between the leads 340 and 342, laser light is emitted from the chip 310 and outputted to the outside through the ball lens 360. In the package, a light sensing element may be contained to monitor the emitting status of the VCSEL.

Figure 12:
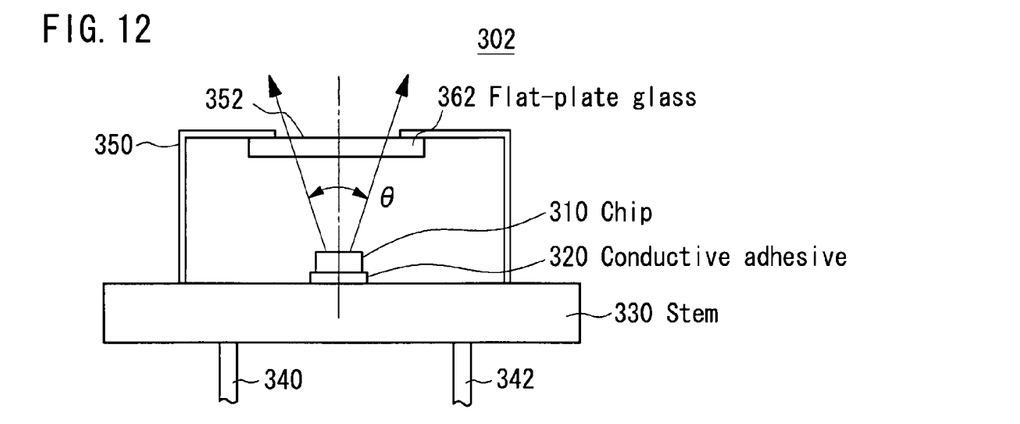
FIG. 12 is a schematic cross sectional view showing a configuration of another package.

FIG. 12 illustrates a configuration of another package, which is preferably used in a spatial transmission system described later. In a package 302 shown in FIG. 12, instead of using the ball lens 360, a flat-plate glass 362 is fixed in the emitting window 352 in a center portion of the cap 350. The center of the flat-plate glass 362 is positioned to match an approximate center of the opening 132 of the chip 310. The distance between the chip 310 and the flat-plate glass 362 is adjusted such that the opening diameter of the flat-plate glass 362 is equal to or greater than the radiation angle E of the laser light from the chip 310.

Figure 13:
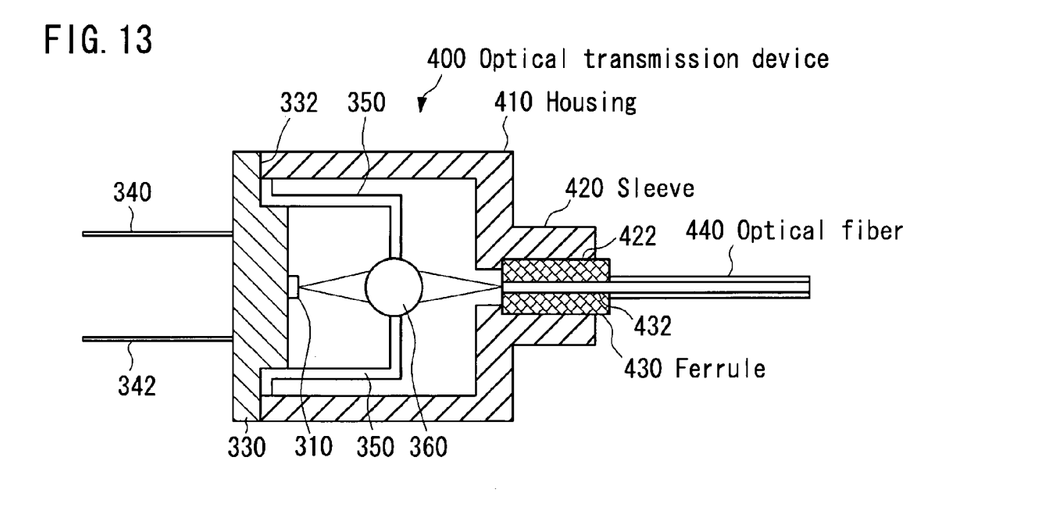
FIG. 13 is a schematic cross sectional view showing a configuration in which the package shown in FIG. 11 is used.

FIG. 13 is a cross sectional view showing a configuration in which the package or module shown in FIG. 11 is applied to an optical transmission device. An optical transmission device 400 includes a cylindrical housing 410 fixed to the stem 330, a sleeve 420 formed integrally with the housing 410 on an edge surface thereof, a ferrule 430 held in an opening 422 of the sleeve 420, and an optical fiber 440 held by the ferrule 430.

In a flange 332 formed in a direction of the circumference of the stem 330, an edge portion of the housing 410 is fixed. The ferrule 430 is positioned exactly in the opening 422 of the sleeve 420, and the optical axis of the optical fiber 440 is aligned with the optical axis of the ball lens 360. In a through hole 432 of the ferrule 430, the core of the optical fiber 440 is held.

Laser light emitted from the surface of the chip 310 is concentrated by the ball lens 360. The concentrated light is injected into the core of the optical fiber 440, and transmitted. While the ball lens 360 is used in the exemplary embodiment described above, other lenses such as a biconvex lens or plano-convex lens may be used. In addition, the optical transmission device 400 may include a driving circuit for applying an electrical signal to the leads 340 and 342. Furthermore, the optical transmission device 400 may have a receiving function for receiving an optical signal via the optical fiber 440.

Figure 14:
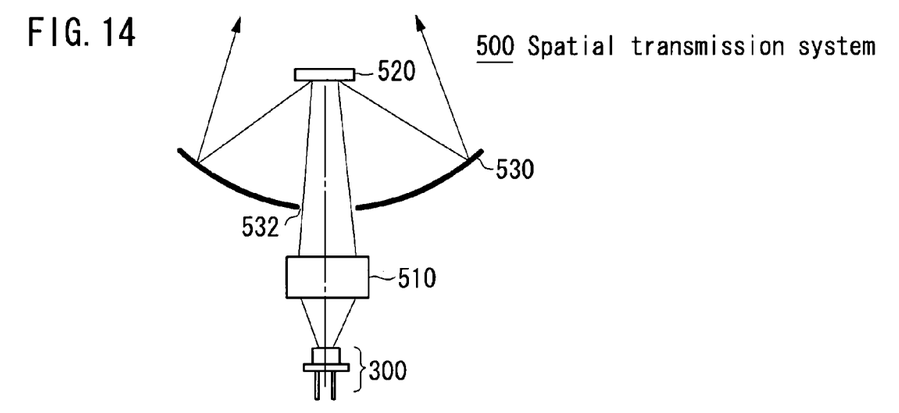
FIG. 14 illustrates a configuration in which the package shown in FIG. 12 is used in a spatial transmission system.

FIG. 14 illustrates a configuration in which the package shown in FIG. 12 is used in a spatial transmission system. A spatial transmission system 500 includes the package 300, a condensing lens 510, a diffusing plate 520, and a reflective mirror 530. In the spatial transmission system 500, instead of using the ball lens 360 that is used for the package 300, the condensing lens 510 is used. But the package with the ball lens may be used instead of module consist of the package with the flat-plate glass and the condensing lens. The light concentrated by the condensing lens 510 is reflected by the diffusing plate 520 through an opening 532 of the reflective mirror 530. The reflected light is reflected toward the reflective mirror 530. The reflective mirror 530 reflects the reflected light toward a predetermined direction to perform optical transmission. For a light source of spatial transmission, a multi-spot type VCSEL may be used to obtain a higher output.

Figure 15:
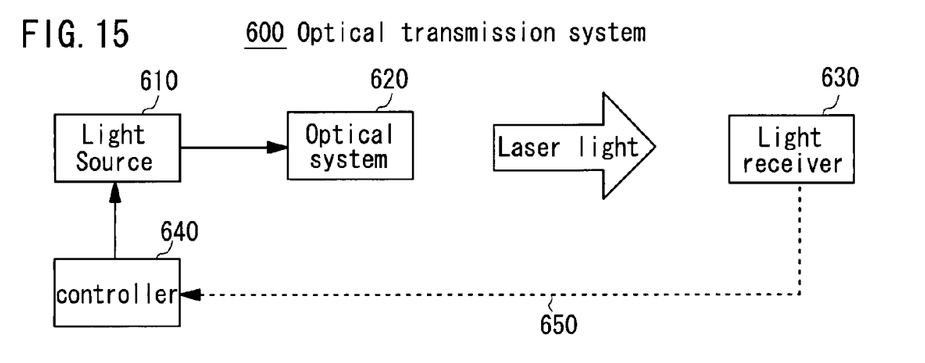
FIG. 15 is a block diagram showing a configuration of an optical transmission system.

FIG. 15 illustrates an example of a configuration of an optical transmission system in which a VCSEL is used as a light source. An optical transmission system 600 includes a light source 610 that contains the chip 310 in which a VCSEL is formed, an optical system 620, for example, for concentrating laser light emitted from the light source 610, a light receiver 630 for receiving laser light outputted from the optical system 620, and a controller 640 for controlling the driving of the light source 610. The controller 640 provides a driving pulse signal for driving the VCSEL to the light source 610. The light emitted from the light source 610 is transmitted through the optical system 620 to the light receiver 630 by means of an optical fiber or a reflective mirror for spatial transmission. The light receiver 630 detects received light by a photo-detector, for example. The light receiver 630 is capable of controlling operations (for example, the start timing of optical transmission) of the controller 640, by a control signal 650.

Figure 16:
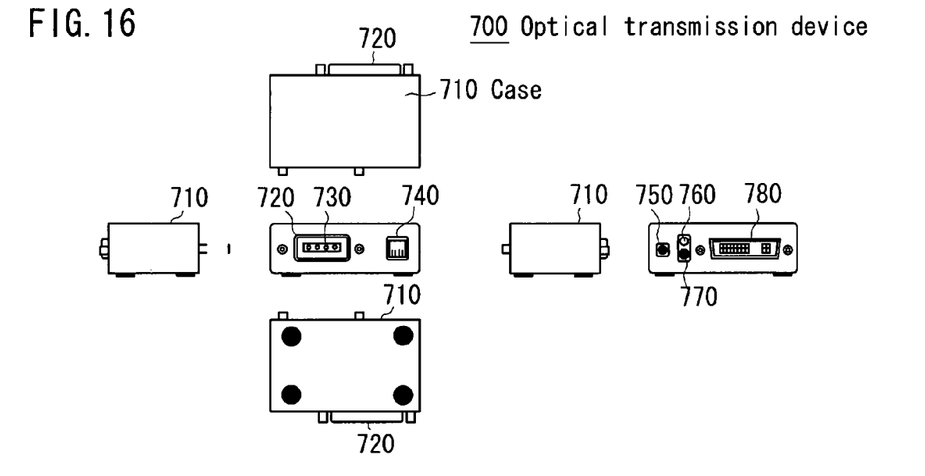
FIG. 16 illustrates an external configuration of an optical transmission device.

Next, a configuration of an optical transmission device used for an optical transmission system is described. FIG. 16 illustrates an external configuration of an optical transmission device. An optical transmission device 700 includes a case 710, an optical signal transmitting/receiving connector 720, a light emitting/light receiving element 730, an electrical signal cable connector 740, a power input 750, an LED 760 for indicating normal operation, an LED 770 for indicating an abnormality, and a DVI connector 780.

Figure 17:
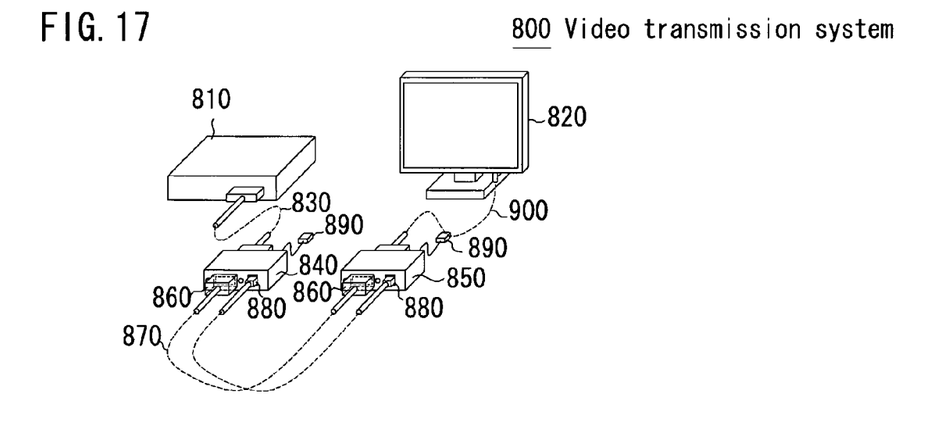
FIG. 17 illustrates a video transmission system in which the optical transmission device of FIG. 16 is used.

Shown in FIG. 17 is a video transmission system in which the optical transmission device 700 is used. A video transmission system 800 includes a video signal generator 810, an image display 820, an electrical cable 830 for DVI, a transmitting module 840, a receiving module 850, connectors 860 for video signal transmission optical signal, an optical fiber 870, cable connectors 880 for controlling signal, power adapters 890, and an electrical cable 900 for DVI. The video transmission system 800 uses the optical transmission system shown in FIG. 16 to transmit a video signal generated at the video signal generator 810 to the image display 820 such as a liquid crystal display.

A VCSEL according to an aspect of the invention can be used in fields such as optical data processing or optical high-speed data communication.

What is claimed is:

1. A vertical-cavity surface-emitting laser diode (VCSEL) comprising:
   a substrate;
   a first semiconductor multilayer of a first conductivity-type;
   an active layer;
   a second semiconductor multilayer of a second conductivity-type, the second semiconductor multilayer constituting a resonator together with the active layer and the first semiconductor multilayer;
   a contact layer;
   each of the layers being stacked on the substrate, and
   a metal layer formed on the contact layer, the metal layer including an opening portion that defines a region that emits laser light;
   and when oscillation wavelength of the laser light is $\lambda$, optical thickness T of the contact layer and a top layer of the second semiconductor multilayer that contacts with the contact layer is in a range from about $0.193\,\lambda$ to about $0.197\,\lambda$ and is out of a range from about $0.153\,\lambda$ to about $0.157\,\lambda$, the contact layer covering the entire surface of the top layer.

2. The VCSEL according to claim 1, wherein the second semiconductor multilayer comprises a plurality of layers being a plurality of pairs of a first semiconductor layer having a first refractive index and a second semiconductor layer having a second refractive index, and optical thickness T that is sum of the thickness of a first semiconductor layer being a top layer of the second semiconductor multilayer and the thickness of the contact layer is smaller than $\lambda/4$.

3. The VCSEL according to claim 1, wherein the difference between the bandgap energy of a first semiconductor layer being the top layer among first semiconductor layers being included in the second semiconductor multilayer, and the bandgap energy of the active layer is equal to or greater than 0.1 electron volts (eV) and equal to or smaller than 0.3 electron volts.

4. The VCSEL according to claim 2, the first and second semiconductor layers are made of AlGaAs having different Al-composition, and the contact layer is made of GaAs.

5. The VCSEL according to claim 2, the Al-composition of the first semiconductor layer is smaller than the Al-composition of the second semiconductor layer.

6. The VCSEL according to claim 1, wherein the metal layer is made of gold or a stacked layer of titanium and gold.

7. The VCSEL according to claim 1, further comprising a current confining layer between the contact layer and the substrate, the current confining layer comprising a high resistance region and a conductive region surrounded by the high resistance region, and the opening portion of the metal layer is about 0 to 3 μm smaller than the diameter of the conductive region.

8. The VCSEL according to claim 7, further comprising a post on the substrate, the post comprising at least a metal layer, a contact layer, a second semiconductor multilayer, and a current confining layer, and a high resistance region of the current confining layer being an oxidized region that is oxidized from a side surface of the post.

9. A module comprising:
   a VCSEL; and an optical member to be implemented,
the VCSEL comprising a substrate, a first semiconductor multilayer of a first conductivity-type, an active layer, a second semiconductor multilayer of a second conductivity-type, the second semiconductor multilayer constituting a resonator together with the active layer and the first semiconductor multiplayer, a contact layer, each of the layers being stacked on the substrate, and a metal layer formed on the contact layer, the metal layer including an opening portion that defines a region that emits laser light, and when oscillation wavelength of the laser light is $\lambda$, optical thickness T of the contact layer and a top layer of the second semiconductor multilayer that contacts with the contact layer is in a range from about 0.193 $\lambda$ to about 0.197 $\lambda$ and is out of a range from about 0.153 $\lambda$ to about 0.157 $\lambda$.

10. A light sending device comprising:
a module; and
a sending component that sends laser light emitted from the module by means of an optical medium,
the module comprising a VCSEL and an optical member to be implemented,
the VCSEL comprising a substrate, a first semiconductor multilayer of a first conductivity-type, an active layer, a second semiconductor multilayer of a second conductivity-type, the second semiconductor multilayer constituting a resonator together with the active layer and the first semiconductor multiplayer, a contact layer, each of the layers being stacked on the substrate, and a metal layer formed on the contact layer, the metal layer including an opening portion that defines a region that emits laser light, and when oscillation wavelength of the laser light is $\lambda$, optical thickness T of the contact layer and a top layer of the second semiconductor multilayer that contacts with the contact layer is in a range from about 0.193 $\lambda$ to about 0.197 $\lambda$ and is out of a range from about 0.153 $\lambda$ to about 0.157 $\lambda$.

11. An optical spatial transmission device comprising:
a module; and
a transmission component that spatially transmits light emitted from the module,
the module comprising a VCSEL and an optical member to be implemented,
the VCSEL comprising a substrate, a first semiconductor multilayer of a first conductivity-type, an active layer, a second semiconductor multilayer of a second conductivity-type, the second semiconductor multilayer constituting a resonator together with the active layer and the first semiconductor multiplayer, a contact layer, each of the layers being stacked on the substrate, and a metal layer formed on the contact layer, the metal layer including an opening portion that defines a region that emits laser light, and when oscillation wavelength of the laser light is $\lambda$, optical thickness T of the contact layer and a top layer of the second semiconductor multilayer that contacts with the contact layer is in a range from about 0.193 $\lambda$ to about 0.197 $\lambda$ and is out of a range from about 0.153 $\lambda$ to about 0.157 $\lambda$.

12. A light sending system comprising:
a module; and
a sending component that sends laser light emitted from the module,
the module comprising a VCSEL and an optical member to be implemented,
the VCSEL comprising a substrate, a first semiconductor multilayer of a first conductivity-type, an active layer, a second semiconductor multilayer of a second conductivity-type, the second semiconductor multilayer constituting a resonator together with the active layer and the first semiconductor multiplayer, a contact layer, each of the layers being stacked on the substrate, and a metal layer formed on the contact layer, the metal layer including an opening portion that defines a region that emits laser light, and when oscillation wavelength of the laser light is $\lambda$, optical thickness T of the contact layer and a top layer of the second semiconductor multilayer that contacts with the contact layer is in a range from about 0.193 $\lambda$ to about 0.197 $\lambda$ and is out of a range from about 0.153 $\lambda$ to about 0.157 $\lambda$.

13. An optical spatial transmission system comprising:
a module; and
a transmission component that spatially transmits light emitted from the module,
the module comprising a VCSEL and an optical member to be implemented,
the VCSEL comprising a substrate, a first semiconductor multilayer of a first conductivity-type, an active layer, a second semiconductor multilayer of a second conductivity-type, the second semiconductor multilayer constituting a resonator together with the active layer and the first semiconductor multiplayer, a contact layer, each of the layers being stacked on the substrate, and a metal layer formed on the contact layer, the metal layer including an opening portion that defines a region that emits laser light, and when oscillation wavelength of the laser light is $\lambda$, optical thickness T of the contact layer and a top layer of the second semiconductor multilayer that contacts with the contact layer is in a range from about 0.193 $\lambda$ to about 0.197 $\lambda$ and is out of a range from about 0.153 $\lambda$ to about 0.157 $\lambda$.

14. A method for manufacturing a vertical-cavity surface-emitting laser diode (VCSEL) comprising:
forming a first semiconductor multilayer of at least a first conductivity-type, on a substrate;
forming an active region on the first semiconductor multilayer;
forming a second semiconductor multilayer of a second conductivity-type on the active region such that the thickness of a top layer of the second semiconductor multilayer being thinner than the thickness of other layers of the second semiconductor multilayer;
forming a contact layer on the second conductivity-type on the second semiconductor multilayer, such that optical thickness T being sum of the thickness of the top layer and the contact layer covering the entire surface of the top layer is in a range from about 0.193 $\lambda$ to about 0.197 $\lambda$ and is out of a range from about 0.153 $\lambda$ to about 0.157 $\lambda$; and
forming a metal layer on the contact layer, the metal layer including an opening portion that defines a region that emits laser light.

15. The method according to claim 14, wherein the second semiconductor multilayer comprising a plurality of semiconductor layers of a plurality of pairs of a first semiconductor layer having a first refractive index and a second semiconductor layer having a second refractive index, and optical thickness T of the thickness of a first semiconductor layer being a top layer of the second semiconductor multilayer and the thickness of the contact layer is smaller than $\lambda/4$, and optical thickness of each of first semiconductor layers other than the first semiconductor layer being the top layer and the second semiconductor layers is equal to $\lambda/4$.

16. The method according to claim 14, wherein the difference between the bandgap energy of the first semiconductor layer being the top layer of the second semiconductor layer among first semiconductor layers being included in the second semiconductor multilayer, and the bandgap energy of the active layer is equal to or greater than 0.1 electron volts (eV) and equal to or smaller than 0.3 electron volts.

17. The method according to claim 15, wherein the first and second semiconductor layer are made of AlGaAs having different Al-composition, and the contact layer is made of GaAs.

18. The method according to claim 17, the Al-composition of the first semiconductor layer is smaller than the Al-composition of the second semiconductor layer.

19. The method according to claim 14, wherein the metal layer is made of gold or a stacked layer of titanium and gold.

20. The method according to claim 14, further comprising;

forming a current confining layer between the substrate and the contact layer, forming a post on the substrate by etching the semiconductor layers on the substrate, and oxidizing outer periphery of the current confining layer from a side surface of the post, wherein the opening portion of the metal layer being about 0 to 3 µm smaller than the diameter of the conductive region surrounded by the oxidized region of the current confining layer.

* * * * *